(12) United States Patent
Jun et al.

(10) Patent No.: US 10,014,374 B2
(45) Date of Patent: Jul. 3, 2018

(54) PLANAR HETEROGENEOUS DEVICE

(71) Applicant: Intel Corporation, Santa Clara, CA (US)

(72) Inventors: Kimin Jun, Hillsboro, OR (US); Patrick Morrow, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/026,271

(22) PCT Filed: Dec. 18, 2013

(86) PCT No.: PCT/US2013/076058
§ 371 (c)(1),
(2) Date: Mar. 31, 2016

(87) PCT Pub. No.: WO2015/094219
PCT Pub. Date: Jun. 25, 2015

(65) Prior Publication Data
US 2016/0247882 A1 Aug. 25, 2016

(51) Int. Cl.
*H01L 27/12* (2006.01)
*H01L 29/10* (2006.01)
(Continued)

(52) U.S. Cl.
CPC .... *H01L 29/1054* (2013.01); *H01L 21/02524* (2013.01); *H01L 21/02538* (2013.01);
(Continued)

(58) Field of Classification Search
CPC ......... H01L 29/10; H01L 29/16; H01L 29/20; H01L 27/12; H01L 29/267; H01L 21/8234; H01L 21/02; H01L 27/092; H01L 29/22
See application file for complete search history.

(56) References Cited

U.S. PATENT DOCUMENTS 6,593,212 B1  7/2003  Kub et al.
6,927,146 B2  8/2005  Brask et al.
(Continued)

FOREIGN PATENT DOCUMENTS

EP   2521168     11/2012
JP   H04372166 A  12/1992
(Continued)

OTHER PUBLICATIONS

Yun, et al., "Transfer of patterned ion-cut silicon layers" Applied Physics Letters, Nov. 9, 1998, 3 pages, vol. 73, No. 19, Electronic Research Laboratory, University of California Berkeley, Berkeley, California 94720.
(Continued)

*Primary Examiner* — Charles Garber
*Assistant Examiner* — Abdulfattah Mustapha
(74) *Attorney, Agent, or Firm* — Trop, Pruner & Hu, P.C.

(57) ABSTRACT

In an embodiment a second semiconductor layer is transferred (e.g., using layer transfer techniques) on top of a first semiconductor layer. The second layer is patterned into desired wells. Between the wells, the first layer is exposed. The exposed first layer is epitaxially grown to the level of the transferred second layer to complete a planar heterogeneous substrate including both S1 and S2. The heterogeneous materials may be utilized such that, for example, a P channel device formed from one of III-V or IV materials is coplanar with an N channel device formed from one of III-V or IV materials. The embodiment requires no lattice parameter compliance due to the second layer being transferred onto the first layer. Also, there is no (or little) buffer and/or hetero-epitaxy. Other embodiments are described herein.

22 Claims, 9 Drawing Sheets

(51) Int. Cl.
  *H01L 29/78*     (2006.01)
  *H01L 21/8258*   (2006.01)
  *H01L 21/02*     (2006.01)
  *H01L 21/8234*   (2006.01)
  *H01L 27/092*    (2006.01)
  *H01L 29/16*     (2006.01)
  *H01L 29/20*     (2006.01)
  *H01L 29/22*     (2006.01)
  *H01L 29/267*    (2006.01)
  *H01L 21/762*    (2006.01)

(52) U.S. Cl.
  CPC .. *H01L 21/02551* (2013.01); *H01L 21/76283* (2013.01); *H01L 21/8258* (2013.01); *H01L 21/823412* (2013.01); *H01L 27/0922* (2013.01); *H01L 27/1207* (2013.01); *H01L 29/16* (2013.01); *H01L 29/20* (2013.01); *H01L 29/22* (2013.01); *H01L 29/267* (2013.01); *H01L 29/78* (2013.01)

(56) References Cited

U.S. PATENT DOCUMENTS

| | | |
|---|---|---|
| 7,662,689 B2 | 2/2010 | Boyanov et al. |
| 8,872,225 B2 | 10/2014 | Chu-Kung et al. |
| 2004/0132267 A1* | 7/2004 | Sadana ............ H01L 21/02381 438/510 |
| 2006/0244065 A1* | 11/2006 | Yamada ............ H01L 29/7841 257/347 |
| 2007/0105256 A1 | 5/2007 | Fitzgerald |
| 2007/0145481 A1* | 6/2007 | Tilke ................ H01L 21/76251 257/347 |
| 2007/0228484 A1* | 10/2007 | Koester ............ H01L 21/76254 257/369 |
| 2008/0012005 A1 | 1/2008 | Yang et al. |
| 2008/0153267 A1 | 6/2008 | Clavelier et al. |
| 2008/0187018 A1 | 8/2008 | Li et al. |
| 2011/0163410 A1 | 7/2011 | Signamarcheix et al. |
| 2012/0309139 A1 | 12/2012 | Liang et al. |
| 2013/0082281 A1 | 4/2013 | LaRoche et al. |

FOREIGN PATENT DOCUMENTS

| | | |
|---|---|---|
| JP | 2007142401 A | 6/2007 |
| JP | 2011228651 A | 11/2011 |
| JP | 2013201449 A | 10/2013 |
| TW | 200816535 | 4/2008 |
| WO | 2004114400 A1 | 12/2004 |
| WO | 2008051503 | 5/2008 |
| WO | 2008148882 A2 | 12/2008 |
| WO | 2012162943 | 12/2012 |

OTHER PUBLICATIONS

International Searching Authority, "Notification of Transmittal of the International Search Report and the Written Opinion of the International Searching Authority," dated Sep. 12, 2014, in International application No. PCT/US2013/076058.

Taiwan Intellectual Property Office, Office Action dated Jul. 1, 2016 in Taiwanese Patent Application No. 103139369.

Japanese Patent Office, Notification of Reasons for Refusal dated Jul. 7, 2017 in Japanese Patent Application No. 2016-526310.

European Patent Office, Extended European Search Report dated Jun. 22, 2017 in European Patent Application No. 13899945.3.

* cited by examiner

PLANAR HETEROGENEOUS DEVICE

TECHNICAL FIELD

An embodiment addresses lattice mismatched semiconductor devices.

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices, such as lasers, detectors and photovoltaics, as well as electronic devices may also be fabricated from various other direct band gap materials, such as, but not limited to, gallium arsenide (GaAs) and indium gallium arsenide (InGaAs).

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

Figure 1:
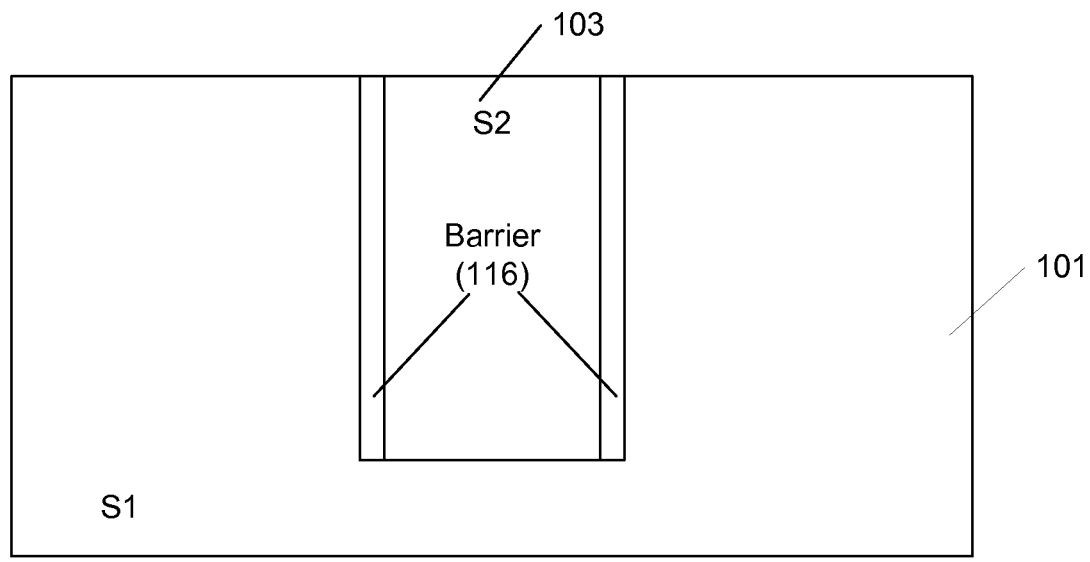
FIG. 1 depicts a conventional aspect ratio confinement structure.

A conventional technique includes Aspect Ratio Trapping (ART). ART is based on threading dislocations that propagate upwards at a specific angle. As seen in FIG. 1, in ART a trench is made in a first semiconductor (S1) 101 with a high enough aspect ratio such that the defects in a second semiconductor (S2) 103 located in the trench terminate on the sidewall of the trench and any layer portion above the terminations is defect free. The trench may or may not include a barrier 116.

Figure 2:
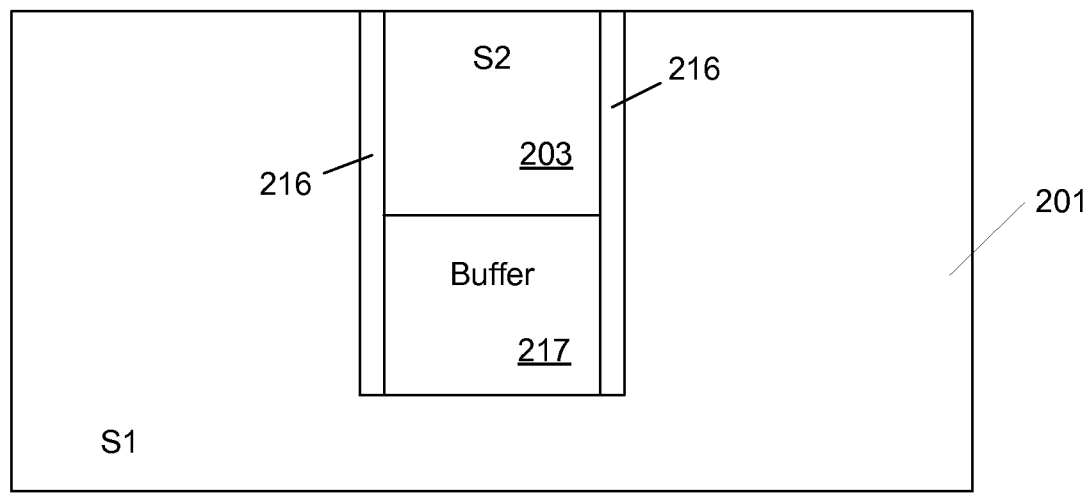
FIG. 2 depicts a conventional lattice mismatch bridging buffer.

As seen in FIG. 2, another conventional technique to manage defects in lattice mismatched configurations involves deposition of a thick buffer 217 (e.g., 0.5 or more microns thick) that bridges the lattice constant difference between the S1 substrate 201 and the layers of interest (e.g., device layers including III-V materials S2 203 and the like). The buffer may between barrier portions 216. In such conventional techniques complicated anneals and compositional grading processes are used to "bend" the defects into each other within the thick buffer so the defects annihilate. Many thick buffer techniques are time consuming, expensive, include undesirable surface roughness of the buffer, and the minimum defect density still remains high.

Further, as scaling progresses and devices get smaller, the space available for a trench or well shrinks. However, the buffer cannot be easily scaled. Therefore, a buffer may need to be coupled with an ART structure. Although ART can reduce the necessary transition layer/buffer thickness, the ART structure itself needs very high aspect ratio patterning. And as scaling progresses, the fabrication of the very high aspect ratio structure becomes more difficult as the space available for the structure (e.g., trench) is limited with smaller devices.

While there are certain groups of materials which have very similar lattice parameters (e.g., Germanium and Gallium Arsenide), there has been limited success integrating these materials with one another in a heterogeneous manner without use of a buffer (or with using a small buffer).

However, an embodiment differs from the conventional methods described above. For example, a second semiconductor layer is transferred (e.g., using layer transfer techniques) on top of a first semiconductor layer. The second layer is then patterned into desired wells. Between the wells, the first layer is exposed. The now exposed first layer is epitaxially grown to the level of the transferred second layer so as to complete a planar heterogeneous substrate including both S1 and S2. The heterogeneous materials may be utilized such that, for example, a P channel device formed from one of III-V or IV materials is coplanar with an N channel device formed from one of III-V or IV materials. The embodiment requires no lattice parameter compliance due to the second layer being transferred onto the first layer. Also, there is no (or little) buffer and/or hetero-epitaxy (where one material grows epitaxially on a different material, albeit in a lattice strained manner). Therefore, a broad array of lattice mismatched materials may be used with each other without a buffer or high aspect ratio confinement structure.

FIGS. 3-11 include a process flow for a planar heterogeneous substrate in an embodiment of the invention.

Figure 3:
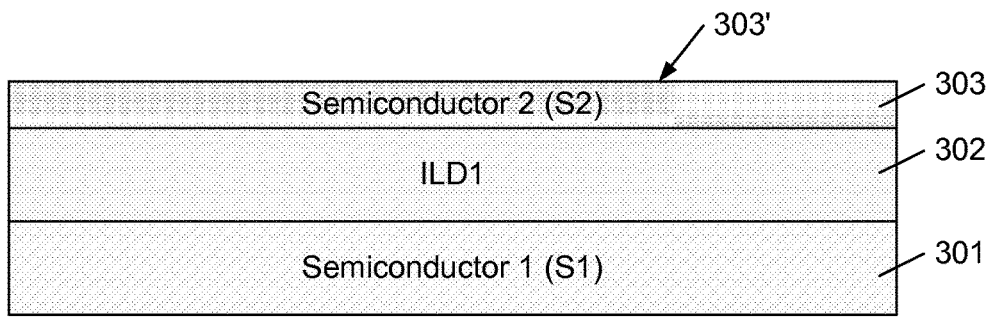
FIGS. 3-11 include a process flow for a planar heterogeneous substrate in an embodiment of the invention.

In FIG. 3 S2 303 and Inter-Layer Dielectric (ILD) 302 are transferred to S1 301. For example, layers 302, 303 may be transferred with an appropriate layer transfer/bonding technique, such as a substrate SiGe On Insulator (SGOI) process where a relaxed SiGe substrate is prepared by growing SiGe on a bulk substrate by an appropriate process and then transferring a relaxed top layer (e.g., portion 303) of the SiGe to a different substrate (e.g., such as to S1 substrate base 301, which may be a silicon oxide wafer) to form the substrate material of FIG. 3.

Another example for layer transfer includes a process where an ILD 302, such as an oxide, is first grown thermally on S2 303 wafer, resulting in an oxide-silicon interface. Next, a high dose of hydrogen (e.g., $5 \times 10^{16}$ ions/cm$^2$) is implanted to form a release interface (i.e., a cleaving layer) in the S2 wafer. Then, the oxide on the S2 wafer is chemically bonded to a surface of the S1 301 wafer (or an oxide portion on S1) to form a buried oxide 302 that is embedded between wafer 303 and wafer 301. After activating the hydrogen thermally at about 500 degrees Centigrade to form voids in the release interface (or possibly less such as 200, 300, or 400 degrees Centigrade), a portion of the seed wafer that is located below the release interface is removed, or cleaved off, at edge 303', leaving behind S2 body 303 attached to buried oxide 302. Then, the bonded structure including layers 301, 302, 303 is subjected to an anneal at a moderate temperature of about 1,100 degrees Centigrade. Finally, a chemical-mechanical polish (CMP) process is performed to smooth surface 303'. The end result is the structure of FIG. 3.

In some embodiments portion 302 may include some oxide that was coupled to S2 (but not S1) before layer transfer and additional oxide that was coupled to S1 (but not S2) before layer transfer. Then the oxide and additional oxide are coupled together during the layer transfer process.

In an embodiment layer 302 may include any of various bonding materials such as oxide, metal, polymer adhesive and the like.

Other embodiments may use other layer transfer processes wherein, for example, a plasma immersion ion implantation (PiII) process may be used to form the release interface, a low-power plasma process is used at room temperature to chemically bond the oxide on the S2 wafer to the S1 wafer, and then a pressurized air burst, such as at room temperature, is used to initiate a crack in the release interface, and then a chemical vapor etch is performed to finish the release interface.

Regardless of the layer transfer technique used and the composition of layer 302, FIG. 3 includes an S2 layer that was transferred onto an S1 layer.

Figure 4:
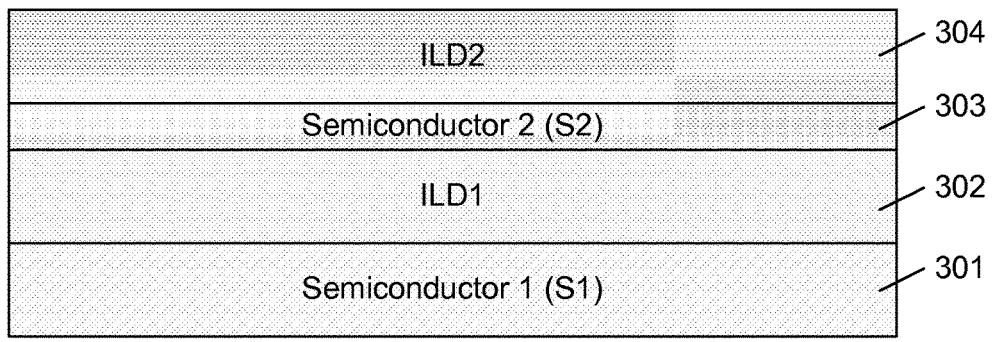
Figure 5:
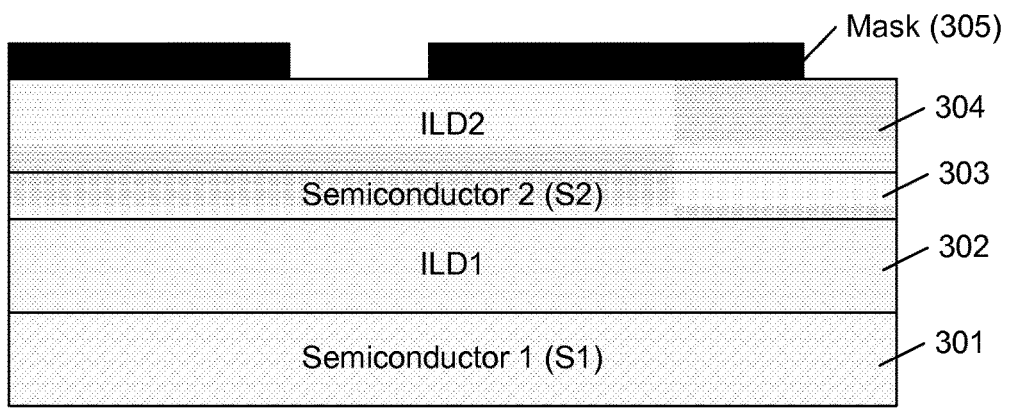
Figure 6:
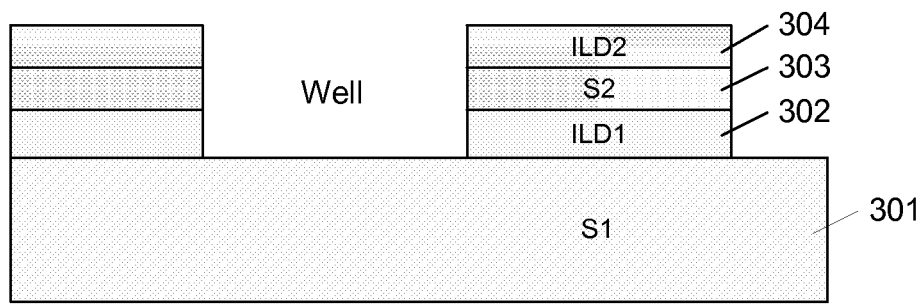
Figure 7:
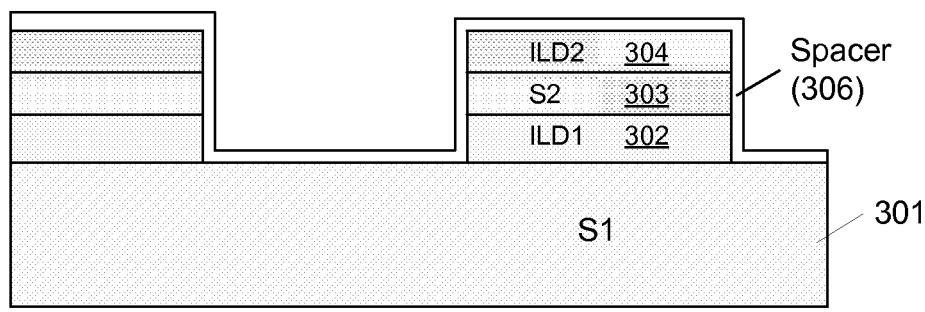
Figure 8:
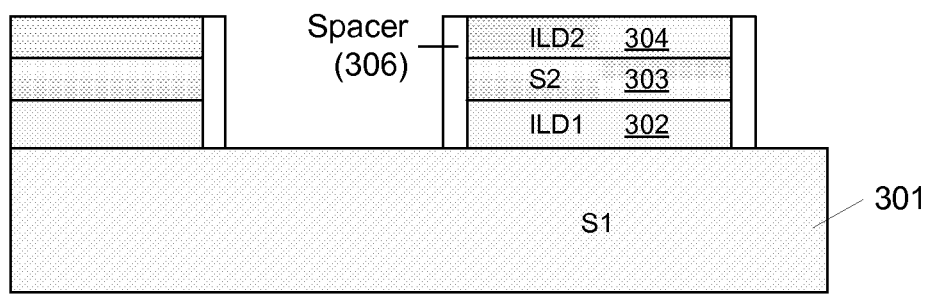

In FIG. 4 blocking layer 304 is formed on layer 303. In an embodiment layer 304 includes a second ILD in addition to ILD 302. In FIG. 5 mask 305 is formed on layer 304 in order to pattern a well. In FIG. 6 the well is indeed formed through layers 304, 303, 302 and the mask layer is removed afterwards. S1 301 is now again exposed. In FIG. 7 spacer layer 306 is formed atop the structure of FIG. 6 and then in FIG. 8 the top surfaces of spacer layer 306 are removed leaving behind the side walls of layer 306.

Figure 9:
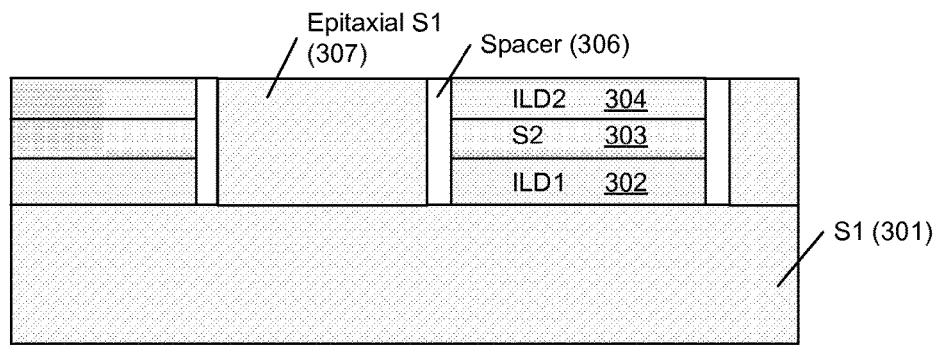
Figure 10:
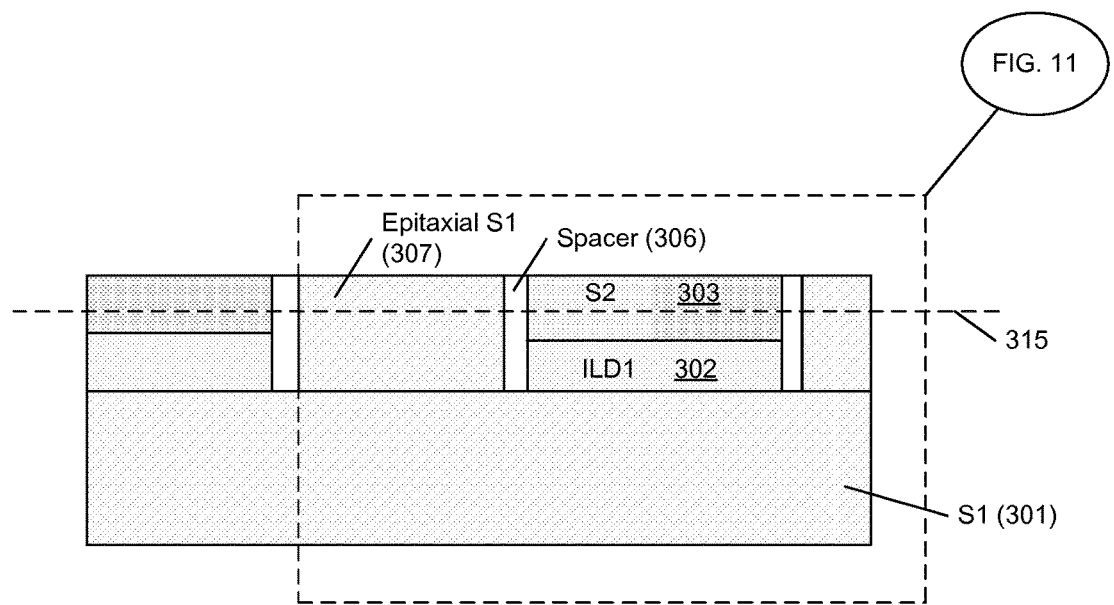

In FIG. 9 S1 portion 307 is epitaxially grown on top of S1 301 and within the well patterned through layers 302, 303, 304 and protected within remaining sidewall portions of spacer 306. In FIG. 10 ILD2 304 is removed and the top of the structure is planarized and ready for device formation.

Figure 11:
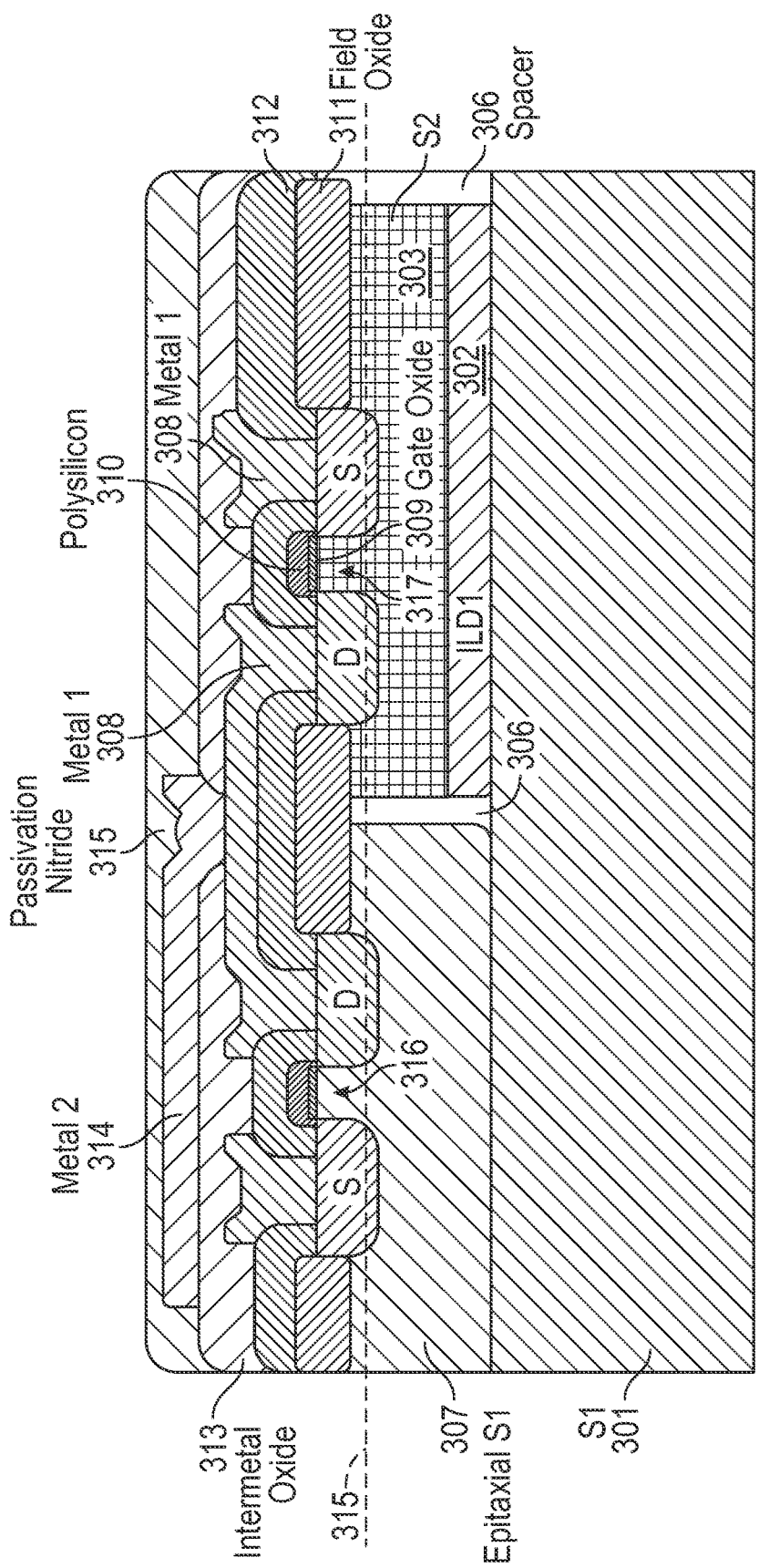

For example, in FIG. 11 the device formation concerns forming N and P channel devices. More specifically, within epitaxially formed S1 307 a source (S) and drain (D) are formed adjacent P channel 316. In S2 303 another source (S) and drain (D) are formed adjacent N channel 317. In other embodiments the P channel may be in S2 303 and the N channel may be in epitaxial S1 307. Additional device processing occurs with the S2 channel device (and the epitaxial S1 device although not discussed herein for sake of brevity) whereby polysilicon 310 is formed on top of gate oxide 309 and channel 317. Metal contacts 308 are then formed for the source and drain along with contact oxide 312, field oxide 311, intermetal oxide 313, and passivation nitride 315. If the P and N channels share a contact, such as the two drains for the P and N channel devices, a metal portion 314 may couple to the contacts for the drains (or sources in other embodiments).

Thus, FIG. 11 depicts an apparatus comprising: a second layer (e.g., the layer including portions 303 and 307) directly over a first layer 301 (e.g., the layer including S1 301); and dielectric 302 between the first and second layers. The second layer includes a first portion (e.g., S2 303) directly over the dielectric 302 and a second portion (e.g., epitaxial S1 307) that is not directly over the dielectric 302. As used herein "layer" includes material portions at a certain height within a device stack and those material portions are not necessarily monolithic with one another or even the same material as one another.

The S2 portion is not epitaxially formed on the S1 layer and the epitaxial S1 307 is epitaxially formed on the S1 layer 301. The 303 and 307 portions are lattice mismatched with one another. For example, the epitaxial S1 307 and S2 303 may each include differing IV, III-V, and II-VI materials such as Ge, SiGe, GaAs, AlGaAs, InGaAs, InAs, and InSb. The lattice mismatch between the two portions may be less than 1% or 2, 3, 4, 5, 6, 7, 8, 9, 10, 11, 12% or more.

Horizontal axis 315, which is parallel to the S1 301 layer, passes through the S2 303 and epitaxial S1 307 portions. In fact, in FIG. 11 axis 315 passes through the source, drain, and channel of both of the P and N channel devices. The passage of the axis through the P and N channel devices renders a planar (within which axis 315 is included) heterogeneous substrate.

Embodiments that rely on layer transfer (e.g., transfer performed based on ion cutting) are not limited by material combinations (i.e., picking materials with same or similar lattice constants). Two or more lattice mismatched materials can be integrated with thin ILD separation (e.g., ILD1 302 is 10 nm or less in thickness with other embodiments having ILD thickness of 3, 4, 5, 6, 7, 8, or 9 nm in thickness). Since the trench/well formed through layers 304, 303, 302—See FIG. 6) is shallow, narrow heterogeneous wells can be readily defined. This is compatible with logic P/N wells which are just a few tens of nanometers deep. Further, the embodiment of FIG. 11 requires no buffer or only a negligible buffer between S1 301 and S1 307.

Figure 12:
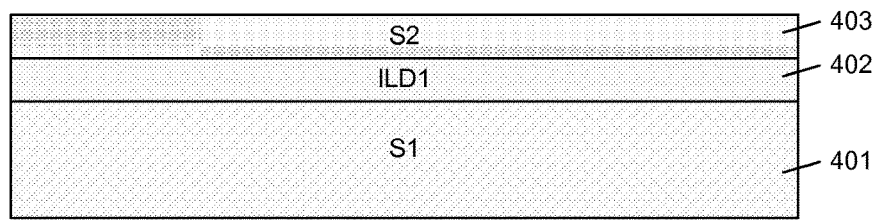
FIGS. 12-16 include another process flow for a planar heterogeneous substrate in an embodiment of the invention.

FIGS. 12-16 include another process flow for a planar heterogeneous substrate in an embodiment of the invention whereby shallow trench isolation (STI) is used instead of spacer 306 of FIG. 7 for dielectric isolation. In FIG. 12 layers 403 (S2) and 402 (ILD 1), or at least a portion of 402, are transferred onto layer 401 (S1) (or onto a portion of 402 that is coupled to S1 401 before the layer transfer occurs).

In some embodiments portion 402 may include some oxide that was coupled to S2 (but not S1) before layer transfer and additional oxide that was coupled to S1 (but not S2) before layer transfer. Then the oxide and additional oxide are coupled together during the layer transfer process. In an embodiment layer 402 may include any of various bonding materials such as oxide, metal, polymer adhesive and the like. Regardless of the layer transfer technique used and the composition of layer 402, FIG. 12 includes an S2 layer that was transferred onto an S1 layer.

Figure 13:
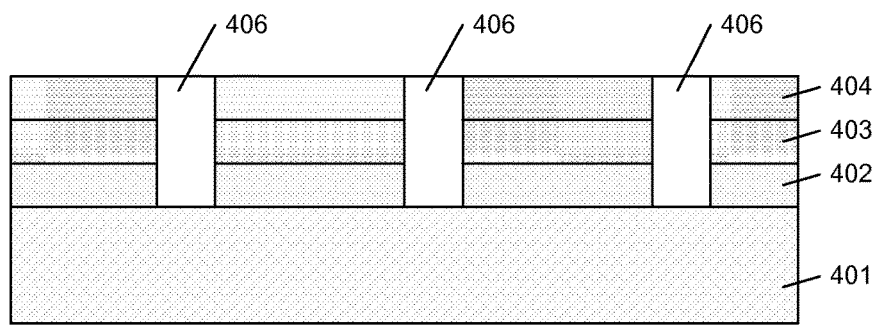
Figure 14:
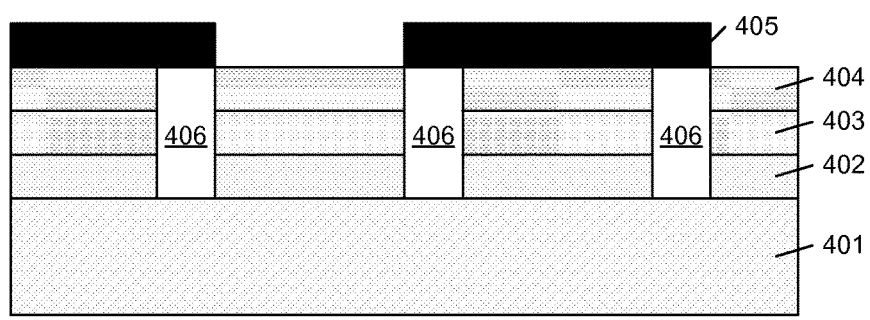
Figure 15:
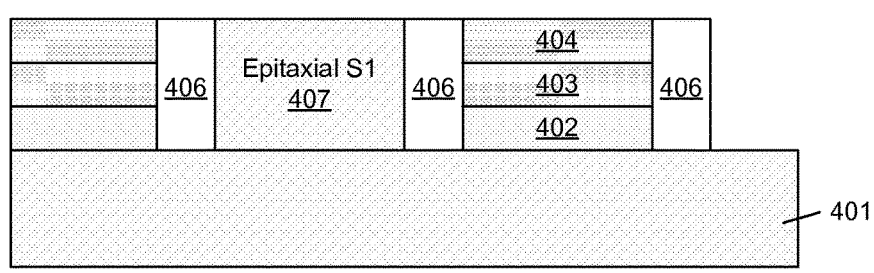
Figure 16:
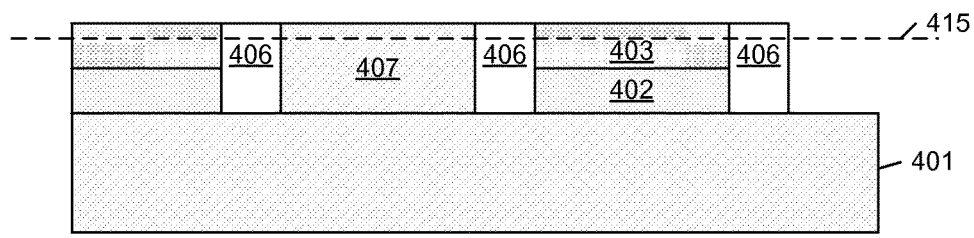

In FIG. 13 barrier layer 404 (e.g., ILD 2) is formed and then STI structures are formed within layers 402, 403, 404. Mask 405 is deposited and patterned (FIG. 14) and then used to form a well through layers 402, 403, 404 and bracketed by STI structures 406 (not shown). In FIG. 15 S1 407 is formed within the well and on S1 401. In FIG. 16 ILD 404 is removed rendering the same structure as described with FIG. 10, only with STI structures instead of space sidewalls. Horizontal axis 415 passes through what will become lattice mismatched devices such as those including channels 316, 317 (i.e., axis 415 is analogous to axis 315). Device formation may then begin as described with FIG. 11.

Figure 17:
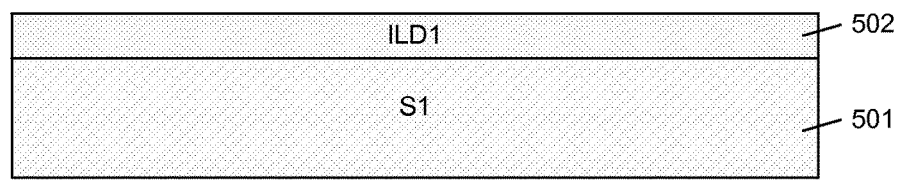
FIGS. 17-22 include an additional process flow for a planar heterogeneous substrate in an embodiment of the invention.
Figure 18:
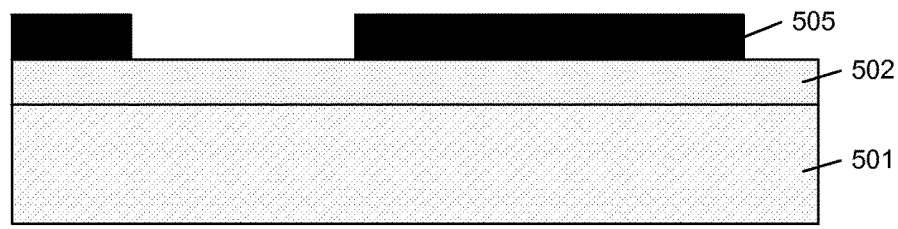
Figure 19:
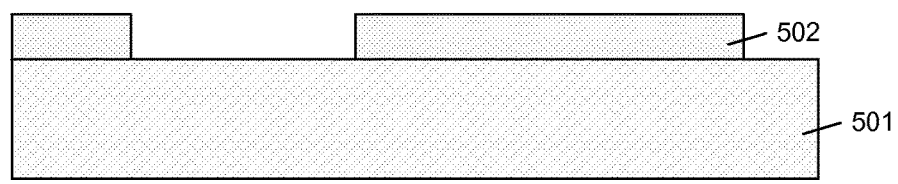
Figure 20:
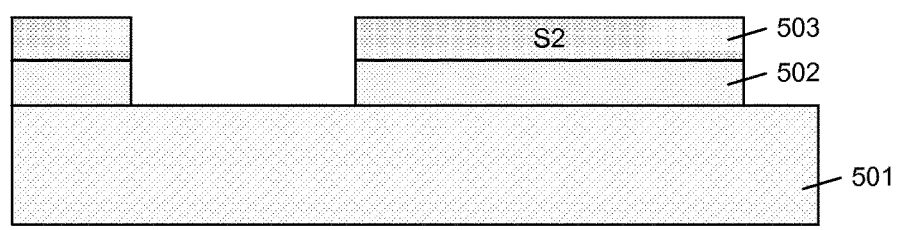

FIGS. 17-22 include an additional process flow for a planar heterogeneous substrate in an embodiment of the invention that relies on partial layer transfer. In FIG. 17 ILD1 502 is formed on S1 501. In FIG. 18 mask 505 is formed on layer 502 and patterned so a well may be formed in layer 502 (FIG. 19). In FIG. 20 a partial layer transfer occurs whereby S2 503 (e.g., In GaAs) is transferred onto layer 502. Note the layer 503 is an island of material that is transferred (unlike the entire layer transfer addressed in FIG. 3).

In some embodiments portion 502 may include some oxide that was coupled to S2 (but not S1) before layer transfer and additional oxide that was coupled to S1 (but not S2) before layer transfer. Then the oxide and additional oxide are coupled together during the layer transfer process. In an embodiment layer 502 may include any of various bonding materials such as oxide, metal, polymer adhesive and the like. Regardless of the layer transfer technique used and the composition of layer 502, FIG. 20 includes an S2 layer that was transferred onto an S1 layer.

As described more fully in PCT Application No. PCT/US2013/075947, a partial layer transfer method comprises: providing a first layer coupled to a first portion of a first bonding material; and a second layer coupled to a second portion of a second bonding material; and partially transferring the first layer over and onto the second layer based on directly connecting the first portion to the second portion and, afterwards, separating a first section of the first layer from a second section of the first layer leaving the first section coupled to the second layer but decoupling the second section from the second layer; wherein first sidewalls of the first portion are unevenly serrated based on separating the first section from the second section.

The partial layer transfer process above can optionally include wherein at least one of the first and second portions is columnar and includes a horizontal surface and vertical surfaces, wherein the horizontal and vertical surfaces are all uncovered and exposed when directly connecting the first portion to the second portion.

The partial layer transfer process above can optionally include wherein the first layer is included in a donor wafer having a first maximum diameter and the second layer is included in a receiving wafer having a second maximum diameter greater than the first maximum diameter.

The partial layer transfer process above can optionally include wherein separating the first section from the second section includes fracturing a layer that includes at least one of hydrogen and helium.

Figure 21:
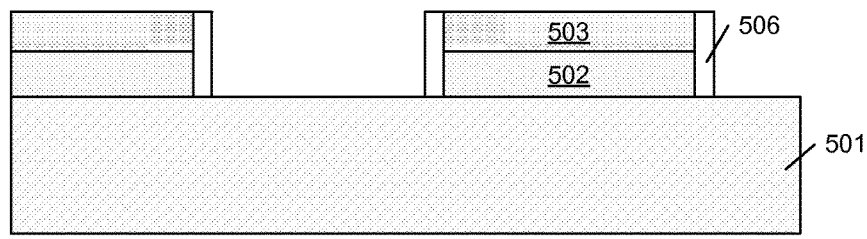
Figure 22:
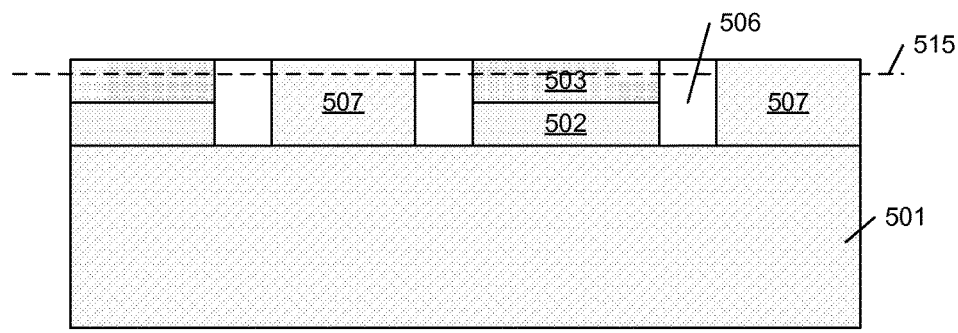

In FIG. 21 a spacer layer is applied and patterned so that only spacer sidewalls 506 remain from the original spacer layer. In FIG. 22 epitaxial S1 507 is formed on S1 501 rendering the same structure as described with FIG. 10. Device processing may then take place as described with FIG. 11. Horizontal axis 515 passes through what will become lattice mismatched devices such as those including channels 316, 317 (i.e., axis 515 is analogous to axis 315).

Figure 23:
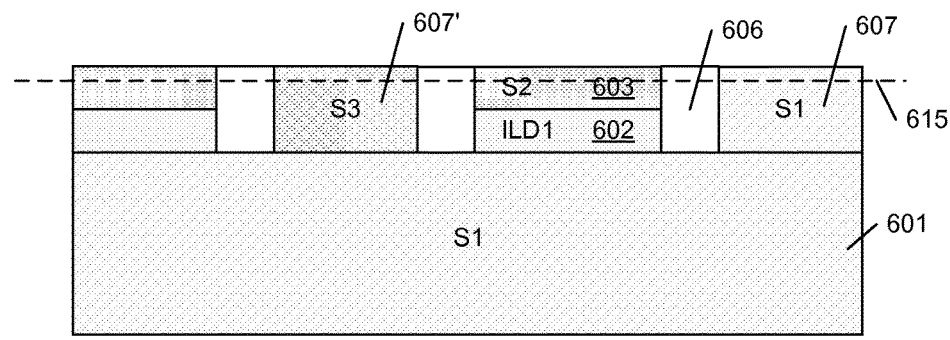
FIG. 23 includes a planar heterogeneous substrate in an embodiment of the invention.

FIG. 23 includes a planar heterogeneous substrate in an embodiment of the invention that goes beyond homogeneous epitaxy (e.g., growth of epitaxial S1 307 on S1 301). For example, in FIG. 23 S2 603 is formed over ILD1 602 and S1 601 as described above. However, the well bracketed by spacer sidewalls 606 and passing through layers 603 and 602 is used to form something other than epitaxial S1. For example, S3 may be grown epitaxially over S1. Thus, if S1 and S3 have close lattice parameters (e.g., InP, InGaAs, and the like) but S2 has a lattice constant much different from S1 and/or S3 then the transferred layer embodiment of FIG. 23 is appropriate. S3 is grown with no or negligible buffer on S1 while S2 is formed by layer transfer. S1 607 may also be grown epitaxially on S1 601 in some embodiments. Horizontal axis 615 passes through what will become lattice mismatched devices such as those including channels in S1, S2, and/or S3 (i.e., axis 615 is analogous to axis 315).

So in FIGS. 23 S2 and S3 are both directly over the S1 layer, where the S1, S2, and S3 layers each include group IV, II-VI, III-V materials and the like and S3 material is lattice mismatched with S1 and/or S2.

Figure 24:
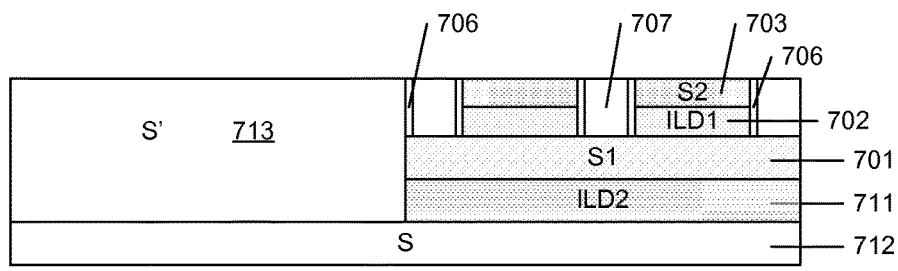
FIG. 24 includes an additional planar heterogeneous substrate in an embodiment of the invention.

FIG. 24 includes an additional planar heterogeneous substrate in an embodiment of the invention. FIG. 24 is similar to FIG. 23 in that a material portion 707 is epitaxially grown on S1 701. Portion 707 may be S1 or S3 as described above. S2 703 is transferred (using whole or partial layer transfer) to the structure. However, FIG. 24 is different in that S1 is formed on ILD2 711, which is on semiconductor (S) material. Also, S' is epitaxially grown on S1 using sidewall spacers 706 (or STI and the like), masks to form wells, and the like as described above.

Thus, in FIG. 24 an S layer is directly below the layers including S1 and S2; and an additional dielectric is between the S and S1 layers. The S is not directly over the dielectric 711 and S' is epitaxially formed on S (where S' may include the same material as S or may include different material from S). S', S1, S2 and/or the material of portion 707 may all be lattice mismatched with one another. Any of S, S', S1, S2, S3 (or whatever is in portion 707) may include devices.

As shown in FIG. 24 an embodiment can integrate more than two layers. FIG. 24 describes a substrate with three different semiconductor layers (S, S1, S2) are integrated. In an embodiment the S1 layer is transferred onto the S layer and the S2 layer is transferred onto the S1 layer. The S2 and ILD1 are patterned, then portion 707 is epitaxially grown and then S1 and ILD2 are patterned and S' is epitaxially grown on S.

Figure 25:
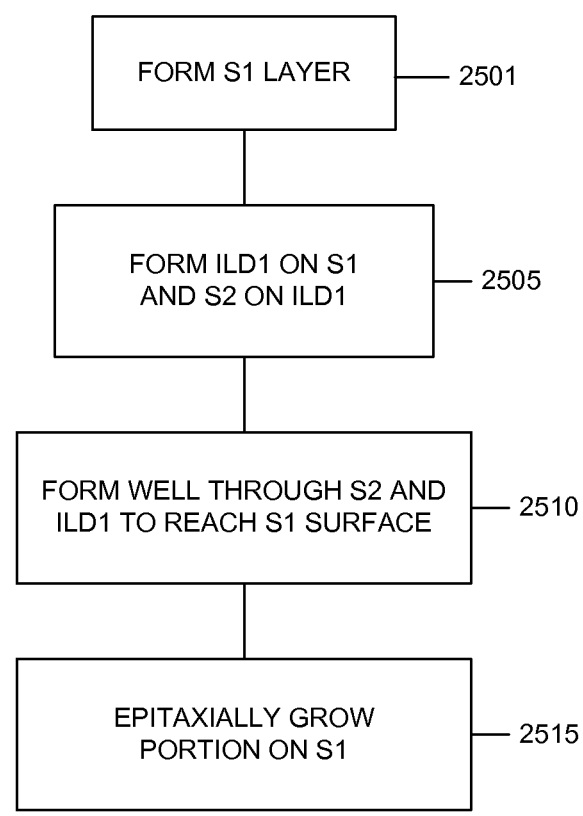
FIG. 25 includes a device formation process in an embodiment of the invention.

FIG. 25 includes a method in an embodiment of the invention. Block 2501 includes forming a first layer. Block 2505 includes forming a second layer on the first layer with a dielectric between the first and second layers. Block 2510 includes forming a well that passes through the S2 and ILD1 layers. Block 2515 includes epitaxially forming another portion (e.g., S3 or S1') on the S1 layer.

Example 1 includes an apparatus comprising: a second layer directly over a first layer; and a dielectric between the first and second layers; wherein (a) the second layer includes a first portion directly over the dielectric and a second portion that is not directly over the dielectric; (b) the first portion is not epitaxially formed on the first layer and the second portion is epitaxially formed on the first layer; (c) the first and second portions are lattice mismatched with one another; and (d) a horizontal axis, which is parallel to the first and second layers, passes through the first and second portions.

Another version of Example 1 includes an apparatus comprising: a second layer directly over a first layer; wherein (a) the second layer includes a first portion separated from the first layer by a dielectric layer and a second portion epitaxially formed on the first layer; (b) the first portion is not epitaxially formed on the first layer; (c) the first and second portions are lattice mismatched with one another; and (d) a horizontal axis, which is parallel to the first and second layers, passes through the first and second portions.

In example 2 the subject matter of the Example 1 can optionally include wherein the first and second portions respectively comprise first and second materials each selected from the group comprising group IV, III-V, and II-VI.

In example 3 the subject matter of the Examples 1-2 can optionally include wherein the first and second portions are both directly over the first layer and the first layer includes the second material.

In example 4 the subject matter of the Examples 1-3 can optionally include the first and second portions are both directly over the first layer; the first layer includes an additional material selected from the group comprising group IV, III-V, and II-VI materials; and the second material is lattice mismatched with the additional material.

In example 5 the subject matter of the Examples 1-4 can optionally include wherein the first and second portions respectively comprise first and second devices each selected from the group comprising N and P channel devices, wherein the first device is of opposite polarity to the second device. For example, a N channel device is of "opposite polarity" to a P channel device in this context.

In example 6 the subject matter of the Examples 1-5 can optionally include wherein the first and second devices each include a channel that the horizontal axis passes through.

In example 7 the subject matter of the Examples 1-6 can optionally include wherein the dielectric includes an oxide, the first portion directly contacts the dielectric, the first layer includes an additional material selected from the group comprising group IV, III-V, and II-VI materials; and the second portion directly contacts the first layer.

In example 8 the subject matter of the Examples 1-7 can optionally include wherein the first portion includes a layer transferred to the apparatus and not grown on the apparatus.

In example 9 the subject matter of the Examples 1-8 can optionally include wherein an insulator portion directly contacts both of the first and second portions and the horizontal axis passes through the first and second portions.

In example 10 the subject matter of the Examples 1-9 can optionally include comprising no buffer directly contacting either of the first and second portions.

In example 11 the subject matter of the Examples 1-10 can optionally include a third layer directly below the first and second layers; and an additional dielectric between the third and first layers; wherein (a) the second layer includes a third portion that is not directly over the dielectric; (b) the third portion is epitaxially formed on the third layer; (c) the first, second, and third portions are lattice mismatched with one another; and (d) the horizontal axis passes through the third portion.

In example 12 the subject matter of the Examples 1-11 can optionally include comprising a third layer; wherein (a) the second layer includes a third portion that is not directly over the dielectric; (b) the third portion is epitaxially formed on the third layer; (c) the third portion is lattice mismatched with at least one of the first and second portions; and (d) the horizontal axis passes through the third portion.

In another example the subject matter of the Examples 1-12 can optionally include wherein a first sidewall of the first portion is unevenly serrated. The uneven serration may be evidence of partial layer transfer. As used herein, the term "unevenly serrated" denotes a rougher surface than is ordinarily associated with semiconductor processing wherein no layer surface is typically completely smooth. However, the roughness of an "unevenly serrated" sidewall in this embodiment is caused due to fracturing that occurs during the cleaving process of partial layer transfer. For example, the donor wafer portion from which the first portion comes from may only be 20 nm thick in some embodiments. As a result, when an upper portion of the donor waiver is mechanically pulled off or separated from the donor portion the thinness of the donor portion (which includes the first portion) causes fracturing/serration at the sidewalls of the first portion because the sidewalls are located at the boundary of the bonded interface between coupling interfaces between the donor and receiver wafers. This is not an edge formed via etching or polishing or smoothing but is instead formed by mechanical fracturing. As a result, first portion sidewalls are rougher than the smoother sidewalls founding on portions of the receiving wafer that interface the donor wafer (because the smoother sidewalls were not formed from mechanical fracturing but instead from a prior processing step of the receiving wafer).

Example 13 includes a second layer directly over a first layer; wherein (a) the second layer includes first and second portions; (b) the first portion is not epitaxially formed on the first layer and the second portion is epitaxially formed on the first layer; (c) the first and second portions are lattice mismatched with one another; (d) a horizontal axis, which is parallel to the first and second layers, passes through the first and second portions; and (e) the first portion does not directly contact the first layer.

In example 14 the subject matter of the Example 13 can optionally include wherein the first and second portions respectively comprise first and second materials each selected from the group comprising group IV and III-V materials.

In example 15 the subject matter of the Examples 13-14 can optionally include wherein the first and second portions are both directly over the first layer and the first layer includes the second material.

In example 16 the subject matter of the Examples 13-15 can optionally include the first and second portions are both directly over the first layer; the first layer includes an additional material selected from the group comprising group IV, III-V, and II-VI materials; and the second material is lattice mismatched with the additional material.

In example 17 the subject matter of the Examples 13-16 can optionally include wherein the first and second portions respectively comprise first and second devices each selected from the group comprising N and P channel devices, wherein the first device includes a first drain of opposite polarity to a second drain of the second device.

In example 18 the subject matter of the Examples 13-17 can optionally include wherein the horizontal axis passes through the first and second drains.

In example 19 the subject matter of the Examples 13-18 can optionally include wherein the first portion includes a layer transferred to the apparatus and not grown on the apparatus.

Example 20 includes a method comprising forming a first layer; forming a second layer on the first layer with a dielectric between the first and second layers, the second layer having a first portion; forming a well that passes through the second layer; and epitaxially forming a second portion, which is included in the second layer, on the first layer and within the well; wherein (a) the first portion is not epitaxially formed on the first layer; (b) the first and second portions are lattice mismatched with one another; and (c) a horizontal axis, which is parallel to the first and second layers, passes through the first and second portions.

In example 21 the subject matter of the Example 20 can optionally include wherein forming the second layer on the first layer includes transferring the second layer from a substrate to the first layer.

In example 22 the subject matter of the Examples 20-21 can optionally include separating the second layer from the substrate by at least one of grinding the substrate off of the second layer, cleaving the substrate from the second layer, and etching the substrate from the second layer.

In example 23 the subject matter of the Examples 20-22 can optionally include forming first and second devices, each selected from the group comprising N and P channel devices, respectively in the first and second portions; wherein the first device includes a first drain of opposite polarity to a second drain of the second device.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:
1. An apparatus comprising:
a second layer directly over a first layer; and
a third layer;
wherein (a) the second layer includes a first portion separated from the first layer by a dielectric layer and a second portion epitaxially formed on the first layer; (b) the first portion is not epitaxially formed on the first layer; (c) the first and second portions are lattice mismatched with one another; (d) a horizontal axis, which is parallel to the first and second layers, passes through the first and second portions, and (e) the second portion directly contacts the first layer;
wherein (a) the second layer includes a third portion that is not directly over the dielectric; (b) the third portion is epitaxially formed on the third layer; (c) the third portion is lattice mismatched with at least one of the first and second portions; and (d) the horizontal axis passes through the third portion.

2. The apparatus of claim 1, wherein the first and second portions respectively comprise first and second materials each selected from the group comprising group IV, III-V, and II-VI materials.

3. The apparatus of claim 2, wherein the first and second portions are both directly over the first layer and the first layer includes the second material.

4. The apparatus of claim 2, wherein:
the first and second portions are both directly over the first layer;
the first layer includes an additional material selected from the group comprising group IV, III-V, and II-VI materials; and
the second material is lattice mismatched with the additional material.

5. The apparatus of claim 2, wherein the first and second portions respectively comprise first and second devices each selected from the group comprising N and P channel devices, wherein the first device is of opposite polarity to the second device.

6. The apparatus of claim 5, wherein the first and second devices each include a channel that the horizontal axis passes through.

7. The apparatus of claim 2, wherein the dielectric includes an oxide, the first portion directly contacts the dielectric, the first layer includes an additional material selected from the group comprising group IV, III-V, and II-VI materials.

8. The apparatus of claim 2, wherein the first portion includes a layer transferred to the apparatus and not grown on the apparatus.

9. The apparatus of claim 1, wherein an insulator portion directly contacts both of the first and second portions.

10. The apparatus of claim 1 comprising no buffer directly contacting either of the first and second portions.

11. The apparatus of claim 1, wherein:
the third layer is directly below the first and second layers; and
an additional dielectric is between the third and first layers.

12. The apparatus of claim 1, wherein a first sidewall of the first portion is unevenly serrated.

13. An apparatus comprising:
a second layer directly over a first layer;
wherein (a) the second layer includes first and second portions and the second portion comprises a second material selected from the group comprising group IV and III-V materials; (b) the first portion is not epitaxially formed on the first layer and the second portion is epitaxially formed on the first layer; (c) the first and second portions are lattice mismatched with one another; (d) a horizontal axis, which is parallel to the first and second layers, passes through the first and second portions; (e) the first portion does not directly contact the first layer; (f) the first portion includes a layer transferred to the apparatus and not grown on the apparatus; (g) the first layer includes an additional material selected from the group comprising group IV, III-V, and II-VI materials; and (h) the second material is lattice mismatched with the additional material.

14. The apparatus of claim 13, wherein the first portion comprises a first material selected from the group comprising group IV and III-V materials.

15. The apparatus of claim 14, wherein the first and second portions are both directly over the first layer and the first layer includes the second material.

16. The apparatus of claim 14, wherein:
the first and second portions are both directly over the first layer.

17. The apparatus of claim 14, wherein the first and second portions respectively comprise first and second devices each selected from the group comprising N and P channel devices, wherein the first device includes a first drain of opposite polarity to a second drain of the second device.

18. The apparatus of claim 17, wherein the horizontal axis passes through the first and second drains.

19. A method comprising:
forming a first layer;
forming a second layer on the first layer with a dielectric between the first and second layers, the second layer having a first portion;
forming a well that passes through the second layer; and
epitaxially forming a second portion, which is included in the second layer, on the first layer and in the well;
wherein (a) the first portion is not epitaxially formed on the first layer; (b) the first and second portions are lattice mismatched with one another; (c) a horizontal axis, which is parallel to the first and second layers, passes through the first and second portions; and (d) forming the second layer on the first layer includes transferring the second layer from a substrate to the first layer.

20. The method of claim 19 comprising separating the second layer from the substrate by at least one of grinding the substrate off of the second layer, cleaving the substrate from the second layer, and etching the substrate from the second layer.

21. The method of claim 19 comprising forming first and second devices, each selected from the group comprising N and P channel devices, respectively in the first and second portions; wherein the first device includes a first drain of opposite polarity to a second drain of the second device.

22. The apparatus of claim 13, wherein a vertical axis intersects the second portion and the first layer but intersects no insulation layer located between the second portion and the first layer.

* * * * *